United States Patent [19]

Bok

[11] Patent Number: 5,266,349
[45] Date of Patent: Nov. 30, 1993

[54] METHOD OF DISCRETE CONFORMAL COATING

[75] Inventor: Hendrik F. Bok, Acushnet, Mass.

[73] Assignee: Specialty Coating Systems Inc., Danbury, Conn.

[21] Appl. No.: 660,072

[22] Filed: Feb. 25, 1991

[51] Int. Cl.⁵ .................................................. B05D 3/12
[52] U.S. Cl. .................................... 427/8; 427/96;
     427/256; 427/287; 427/375; 427/421; 427/424
[58] Field of Search .................. 427/424, 421, 8, 96,
     427/287, 256, 10, 375

[56] References Cited

U.S. PATENT DOCUMENTS

| | | | |
|---|---|---|---|
| 3,461,840 | 4/1966 | Turner | 427/420 |
| 3,556,411 | 1/1971 | Nord et al. | 239/581 |
| 3,843,055 | 10/1974 | Nord et al. | 239/599 |
| 3,858,812 | 1/1975 | Williams et al. | 239/599 |
| 3,923,253 | 12/1975 | Stewart | 239/443 |
| 4,207,356 | 6/1980 | Waugh | 427/55 |
| 4,346,849 | 8/1982 | Rood | 239/597 |
| 4,349,947 | 9/1982 | Rood | 29/157 C |
| 4,485,388 | 11/1984 | Sayko | 346/140 |
| 4,578,290 | 8/1986 | Komon et al. | 427/421 |
| 4,600,601 | 7/1986 | Tamura | 427/96 |
| 4,695,482 | 9/1987 | Weiswurm | 427/96 |
| 4,698,240 | 10/1987 | Ono et al. | 427/58 |
| 4,753,819 | 6/1988 | Shimada | 427/96 |
| 4,842,887 | 6/1989 | Bolte | 427/10 |
| 4,906,326 | 3/1990 | Ameniya et al. | 427/8 |
| 4,922,269 | 5/1990 | Ikeda et al. | 346/146 R |

FOREIGN PATENT DOCUMENTS 0230782 5/1987 European Pat. Off. .

*Primary Examiner*—Janyce Bell
*Attorney, Agent, or Firm*—W. K. Volles

[57] ABSTRACT

Spray coating, particularly flat spray coating of circuit boards. Applicant's method of discrete conformal coating eliminates "railroading" at the edges of the flat spray web and assures precise control of the amount of coating material placed on the circuit board surface, as well as on the varying and complex circuit board components. The method includes pressurizing the coating; longitudinally advancing a surface to be coated, such as a circuit board, beneath the coating, while simultaneously feeding the coating onto the advancing surface as a plural series of aligned droplets extending transversely across the advancing surface. The feeding of coating is triggered "ON/OFF" so as to define longitudinally the series of droplets feeding onto the advancing surface.

10 Claims, 10 Drawing Sheets

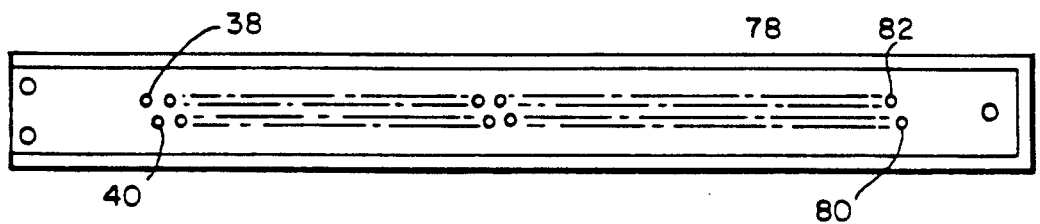
FIG. 7
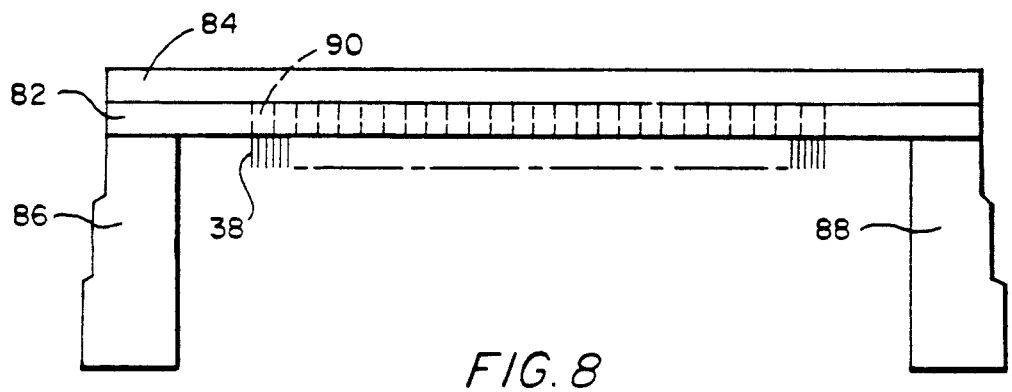
FIG. 8
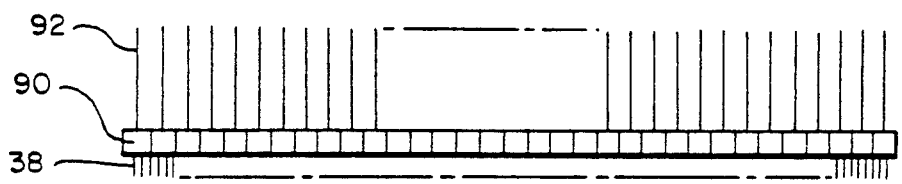
FIG. 9
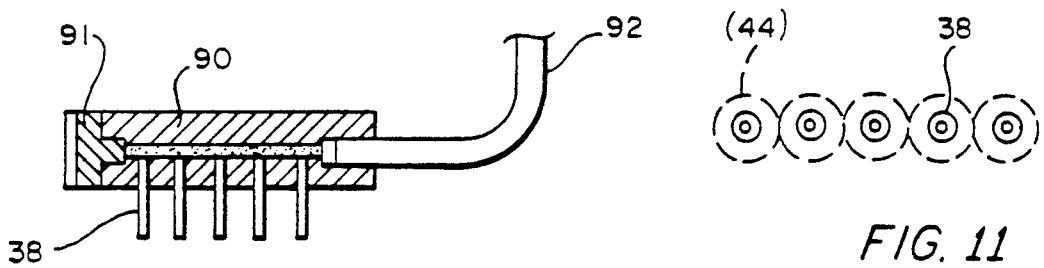
FIG. 10
FIG. 11

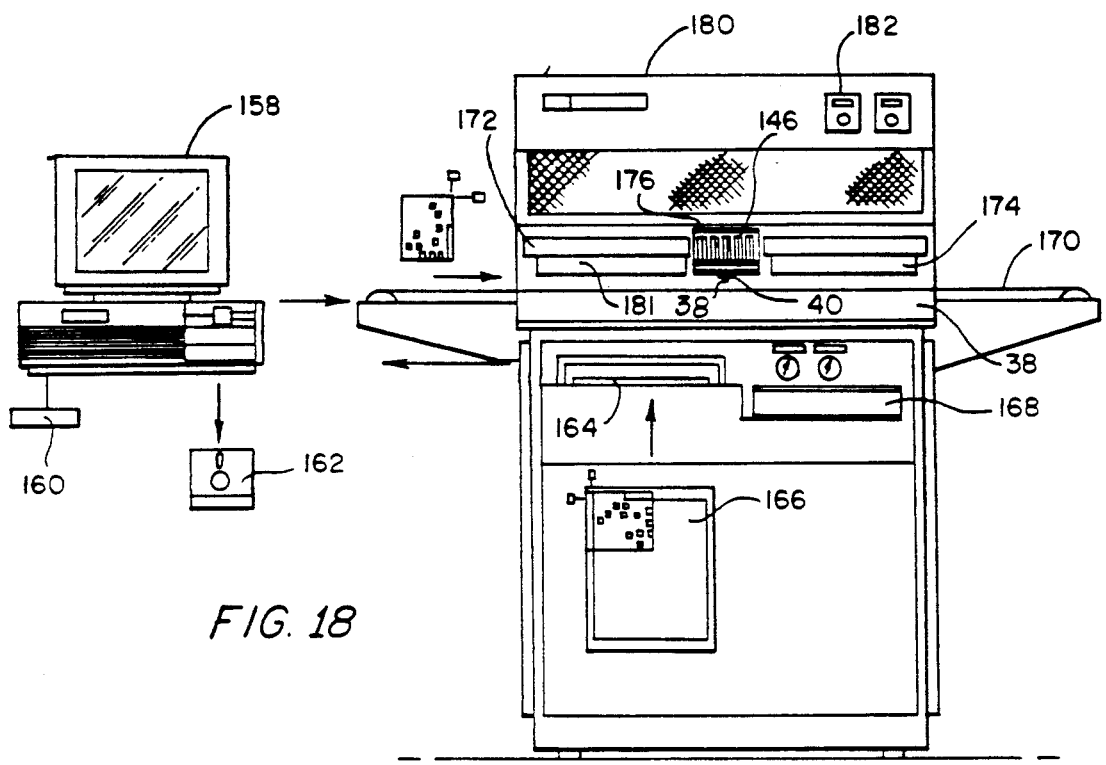
FIG. 18
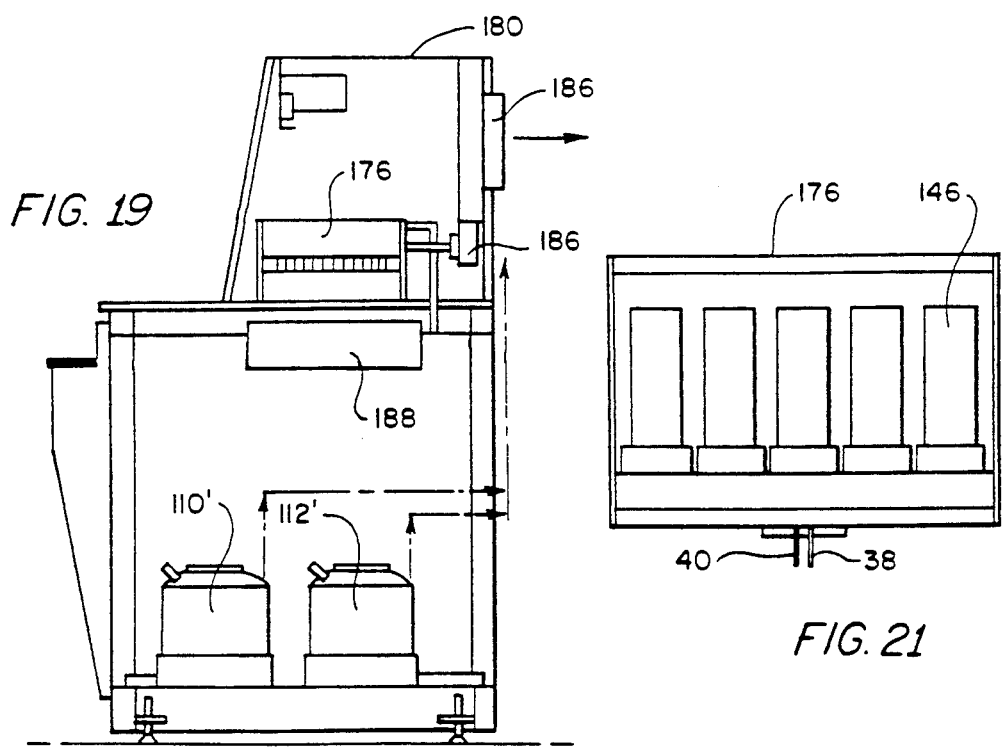
FIG. 19
FIG. 21

METHOD OF DISCRETE CONFORMAL COATING

CROSS-REFERENCE TO RELATED APPLICATIONS

An improvement upon applicant's METHOD OF CONFORMAL COATING (U.S. Ser. No. 07/205,889), filed: Jun. 13, 1988, now U.S. Pat. No. 5,017,409.

BACKGROUND OF THE INVENTION

1. Field of the Invention

Spray coating, particularly conformal coating of printed wiring boards. The method of applying conformal coatings onto the component or circuit side of a printed wiring board by applying a film of coating material which is extruded through a pressurized spray nozzle.

2. The Prior Art

| | |
|---|---|
| TURNER | 3,461,840 |
| NORD et al. | 3,556,441 |
| NORD et al. | 3,843,055 |
| WILLIAMS et al. | 3,858,812 |
| STEWART | 3,923,253 |
| WAUGH | 4,207,356 |
| ROOD | 4,346,849 |
| ROOD | 4,349,947 |
| KOMON et al. | 4,578,290 |
| TAMURA | 4,600,601 |
| ONO et al. | 4,698,240 |
| SHIMADA | EOP 230 782 |

Being discussed in a forthcoming Information Disclosure Statement.

BACKGROUND OF THE INVENTION

The need to conformally coat assembled printed wiring boards evolved in the early 1960's, as it was recognized that the electronic boards needed protection from the environment, humidity, gasses, rapid temperature changes, fungus, and the like. Initially, a two-component epoxide coating was used which, after application, formed a 10 mils thick film on the planar areas of the printed wiring board and much thicker fillets at the base of the individual components. Eventually Military Specification MIL-I-46058 was developed, defining coating thicknesses ranging from one to three mils. From that time on, all military boards have been subject to specifications that require coating materials to be applied within this range. Industrial printed wiring boards also experienced an increase in demand for a protective coating, as line widths and spacings and solder pads and lead spacing of IC's and hybrid packages were restricted.

A typical conformal coating process includes cleaning, masking, coating, curing, demasking and touch-up of the printed wiring board.

Masking is sometimes tedious and requires a high degree of manual skill. Materials used include paper, vinyl and other plastic tapes, peelable latex coatings, silicone caps and the like. In most cases, this masking effort adds considerable expense in manufacturing the printed wiring boards.

After the printed wiring boards have been masked, the coating material is applied either by spraying, which can be performed either by machine or manually using a multiple, four directional spray pattern or by dip coating.

Once the coating is cured, the masking material is manually removed. During the demasking process, the adjacent coating film may be inadvertently lifted, thus requiring repair. Also, if the masking material has covered areas which require coating, additional touch-up is required. Thus the industry has continually been looking either to automate masking or to selectively apply the coating and, thereby, eliminate the need for masking.

A method for selectively coating printed wiring boards was introduced a few years ago and has been defined in NORDSON/SHIMADA (U.S. Pat. No. 4,753,819). The technique utilizes a film-forming fluid nozzle to form a web much like a miniature curtain, as illustrated herewith in FIG. 1. As is the case with any kind of a curtain pattern, the web can only be sustained by two heavy side streams, each stream defining the edges of the web. In general, a web width of between 0.4 to 0.6 inch is maintained by changes in the fluid pressure.

The web is moved back and forth across the length of the board being automatically stopped and started in order to deposit the coating in selective areas. After the first pass the web is indexed, and during the second pass another web is applied adjacent to the previously applied web. The two webs are designed to meet one another or to have a slight overlap, thus creating an uninterrupted film.

Thus, the entire board is coated with overlapping ribbons of coating material. The needle valve controlling the flow of coating through a nozzle is activated automatically. One of the problems with this process is due to the relatively high speed of the traversing filming-nozzle. The output of the nozzle is approximately 100 ml/minute (1.66 ml per second), thus necessitating a linear nozzle velocity of approximately 20 inches per second in order to deposit the desired coating thickness on the stationary band. This high application speed causes shadow effects on the taller components of the band, resulting in a lack of complete coating coverage. "ON/OFF" positions, indexed according to the pattern to be deposited, need to anticipate early needle closing and opening, as a considerable amount of coating material is "in transit" at the time of the needle closing and, of course, the web needs to be established sequentially of opening the needle.

As illustrated herewith in FIG. 1, a "railroad track" pattern 30, 32 formed by the NORDSON/SHIMADA web 36 will flow together and will create a relatively even film. However, when web 36 is placed adjacent to a web previously applied, the heavy edges 30, 32 of the web will force small bubbles into the wet film. These air bubbles then might not be able to break through the surface of the coating, thus causing voids in an otherwise continuous film.

In any case, 80% of the suspended film in web 36 is contained in the two side streams or tracks 30, 32. A web 36 ranging from 0.4 to 0.6 inch wide, which after flow out and leveling measures 0.6 to 0.8 inch, cannot be used to coat to very narrow tolerances. For these areas, simply rotating nozzle 34 ninety degrees only increases the coating deposition because the same coating flow rate is now applied in a very narrow web.

In general, it is not very difficult to apply solvent based coatings below the maximum allowable thicknesses as specified in Military Specification MIL-I-

46058. Coatings of 100% solids, however, present a real challenge to maintain control of thickness, because of lack of solvent evaporation and associated coating thickness reduction. Also, solutions for application to small size orifices and the faster nozzle velocities, both present difficult problems to solve.

Consequently, applicant's discrete conformal coating method has been developed to eliminate the problems associated with the web-filming or conformal coating processes.

SUMMARY OF THE INVENTION

Method for conformal coating of printed wiring boards so as to control discretely the amount of coating material applied in a spray pattern to the circuit board, so as to prevent "railroading" or "fishtailing" at the sides of the pattern and so as to enable discrete masking of circuit board components which are to be protected from the coating. Applicant pressurizes the coating while longitudinally advancing the printed circuit board beneath the coating and simultaneously feeding the coating onto the advancing surface of the circuit board as a plural series of aligned droplets extending transversely across the advancing board surface. The feeding of coating is triggered ON and OFF so as to space and define longitudinally the series of droplets feeding onto the advancing surface.

DESCRIPTION OF THE DRAWINGS

FIG. 7 is a bottom plan of applicant's coating feeding manifold 82 employing pumps at either side for feeding coating material through channels engraved in the manifold so as to interconnect the individual dispense needles or feeding tubes 38, 40 in the aligned series 78, 80.

FIG. 8 is a side elevation of the FIG. 7 manifold 84 supporting 128 dispensing needles 38, 40 and employing pump blocks 86, 88 at either side.

FIG. 9 is an enlarged side schematic of the thirty-two coating sections 92 being fed by coating tubes 92, each section supporting four needles 38, 40.

FIG. 10 is a fragmentary transverse section through coating section 90 and feeding tube 92.

FIG. 11 is a bottom plan showing the individual droplets pattern 42 after flowing together on the surface of the advancing board.

FIG. 18 is a front elevation, of a coating machine, such as illustrated in FIG. 14 and employing an optical scanner.

FIG. 19 is a side elevation of the machine illustrated in FIG. 18.

FIG. 21 is an enlarged schematic view showing the coating applicator of the device illustrated in FIG. 18.

DESCRIPTION OF THE PREFERRED EMBODIMENTS

Figure 2:
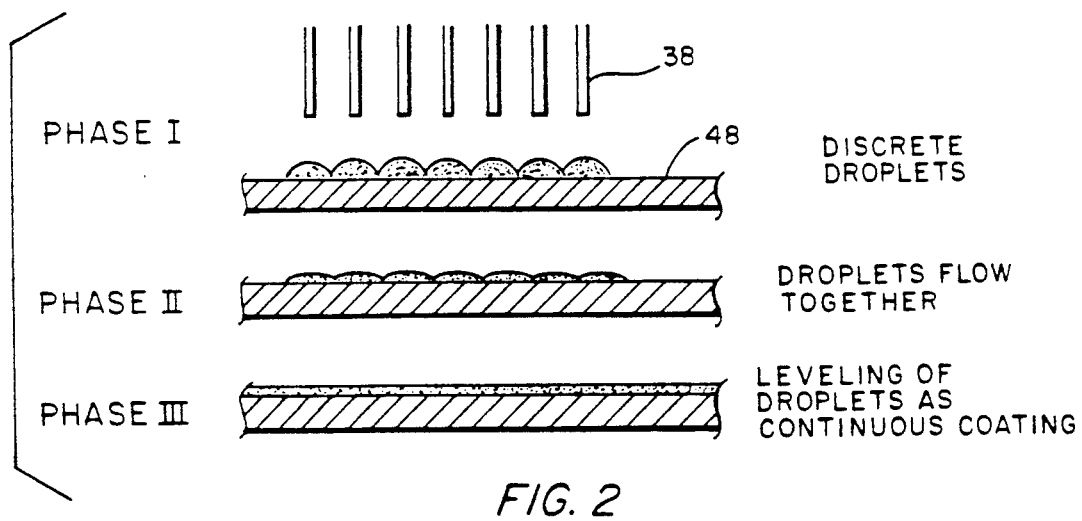
FIG. 2 is a schematic view according to applicant's method of discrete conformal coating, wherein the pressurized coating is fed onto an advancing surface of the circuit board as plural series of aligned droplets extending transversely across the advancing surface.

Applicant's coating applicator consists of parallel transversely aligned series of individual orifices 38, 40 spaced 0.10 inches apart, each series with an overall typical length of 10 inches, as illustrated in FIG. 2. In-line to each orifice may be a solenoid controlled valve 146, or pump 86, 88, which feeds tiny droplets 42 of coating material at a rate between 5 to 30 droplets per second. The size of droplets 42 is controlled by the orifice size, feed pressure, viscosity of coating material, pump or valve cycling and duty cycle. As illustrated in FIG. 2, droplets 42 are larger than those created by conventional air atomized spray coating, which after striking the surface of the advancing wiring board 48, droplets 42 quickly flow together as at 44 and after levelling create a continuous film 46. But, unlike spray coating, droplets 42 fall straight down from orifices 38, 40, positioned 1.0 to 1.5 inches above the planar board surface. Essentially, applicant eliminates air borne overspray which is typical of conventional spray coating. Since the volume left in the supply tube 92 and orifices 38, 40 is zero (zero dead volume), and each droplet 42 leaves the orifice with some velocity, the "ON/OFF" flow of the stream of droplets is instantaneous and precise. Also, because the small droplets 42 are placed side-by-side and are not splashed into one another, air bubbles are not created in the resultant wet film 46.

When all the pulsing solenoid valves 146 are energized collectively (or the pumps 86, 88 are activated), board 48 is advanced beneath the applicator at a speed typically of 1" per second. As a result, a large number of evenly spaced droplets 44 which almost touch one another are formed on board 48 surface; subsequently, the droplets flow together to form a continuous film 46. The speed of advancing board 48 may be varied from 0.5 to 5 inches per second.

Since the diameter of the orifices 38, 40 is approximately 0.0155 inch, a single orifice can coat to tolerances as narrow as 0.10 inch. Accordingly, open areas of 0.10 to 0.10 inch—such as test points, metal shielding partitions, etc., can be effectively "masked" or avoided.

As illustrated in FIG. 18, a program can easily be created using a series of optical sensors, positioned at the same center lines as the coating orifices, to scan a positive film of the board, having uncoated areas opaqued. Such optical sensing will be completed at the same speed as the board is advanced. A coating pattern is thus created without tedious programming, and the program may be stored on a disk with an identity typical of the particular board layout. The coating is then fed onto the board in one sweep as board 48 is advanced, while the open or "masked" areas as seen by the optical scanner are left uncoated.

Because coating materials are generally supplied prefiltered and do not contain any appreciable solid particles, the coating materials are easily filtered to 40 microns. The coating materials pass through a filter inside the applicator's enclosure just prior to being dispersed to each solenoid-driven valve or the manifold pumps. Both filter and internal supply manifold have been designed to hold only a small volume of liquid.

Figure 17:
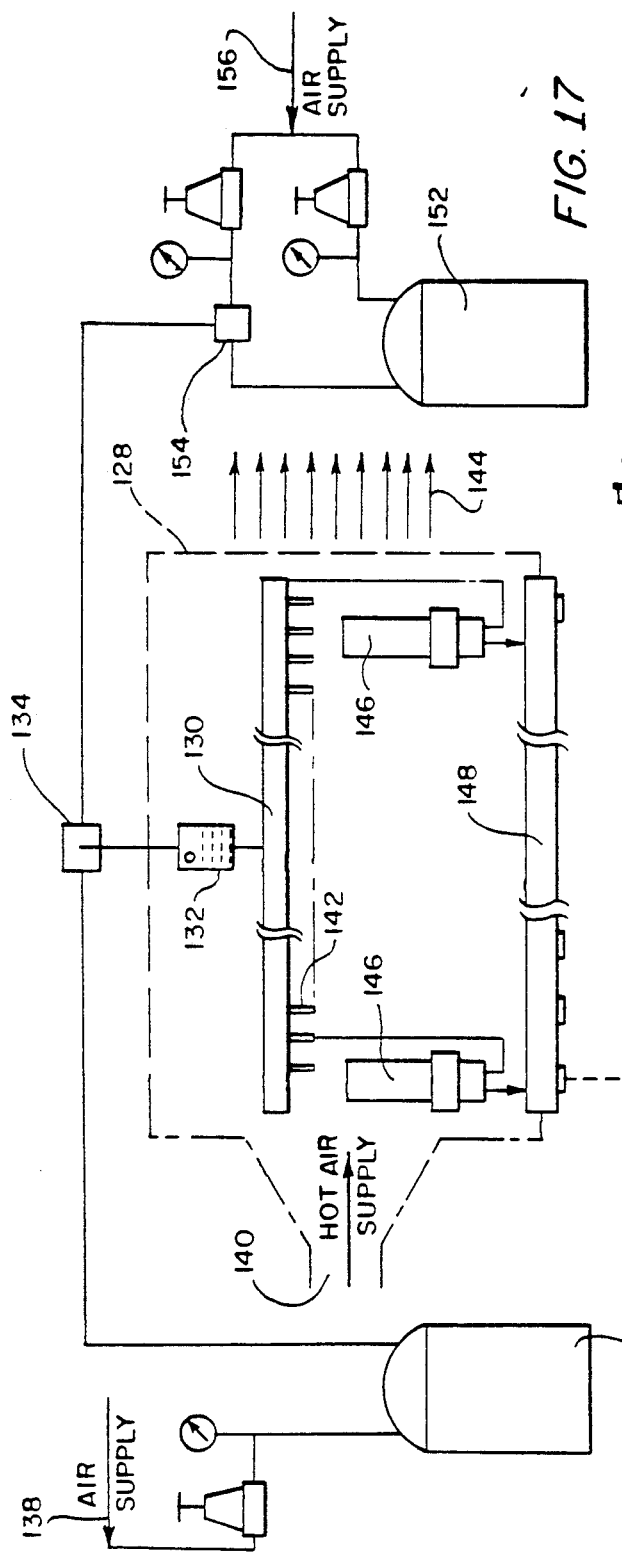
FIG. 17 is a schematic showing of a discrete conformal coating machine embodying a supply manifold with individual valves feeding coating through sapphire orifice 150, so as to develop droplets 42.

In order to clean the applicator of any coating material, a 3-way selector valve 134 allows fast flushing of the filter, manifold, valves and orifices as for example in FIG. 17.

Figure 1:
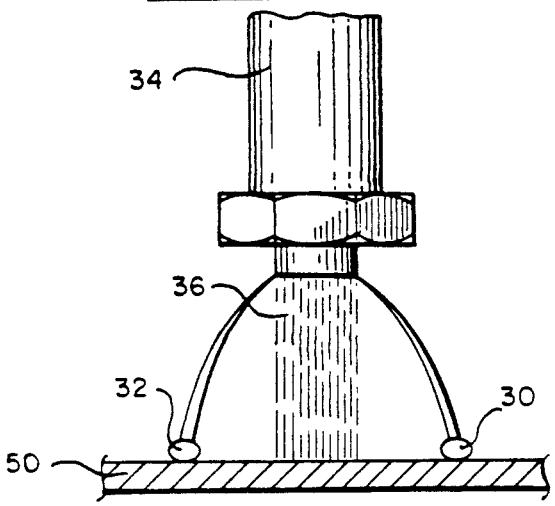
FIG. 1 is a schematic front elevational view of the flat spray pattern or curtain pattern of coating wherein fishtailing or railroading forms at the edges of the pattern as in NORDSON/SHIMADA U.S. Pat. No. 4,753,819.

In FIG. 1 there is illustrated the conventional flat spray pattern as in NORDSON/SHIMADA U.S. Pat. No. 4,753,819 wherein web 36 of coating material is discharged through nozzle 38 and onto printed circuit board 50. Web 36 is formed by means of side streams 32, 30 which form "railroad tracks" on the surface of the printed circuit board. This "railroad track" effect is further illustrated in FIG. 3 wherein the web 36 is advanced in a series of contiguous or overlaping patters over the surface of the circuit board, embodying individualized components 52, 54, 56, 58, 60. A shadowing or miss effect 62 is developed, wherein the geometry of the component 52 precludes deposition of the coating.

According to applicant's method of conformal coating, the coating is pressurized then fed as a plural series 78, 80 of aligned droplets 42 extending transversely across the surface of printed circuit board 48 being advanced underneath. As illustrated in FIG. 2, applicant's Phase I embodies the feeding downwardly of droplets 42 from individual nozzles 38, 40. The nozzles or needles 38, 40 in each series are approximately 0.0155 diameter and spaced apart approximately 0.106 inches.

In Phase II, droplets 42 begin flowing together as at 44 on the advancing board surface, and in Phase 111, there is a leveling of droplets as a continuous coating 46.

Figure 4:
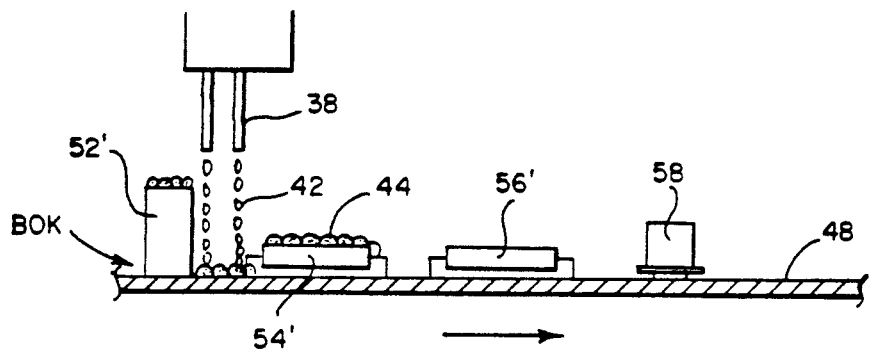
FIG. 4 is a schematic view of applicant's method of discrete conformal coating wherein the feeding of the coating material as individual droplets 42 eliminates the shadow effect and uniformly coats both the components 52', 54', as well as the intervening spaces and solder pad.
Figure 6:
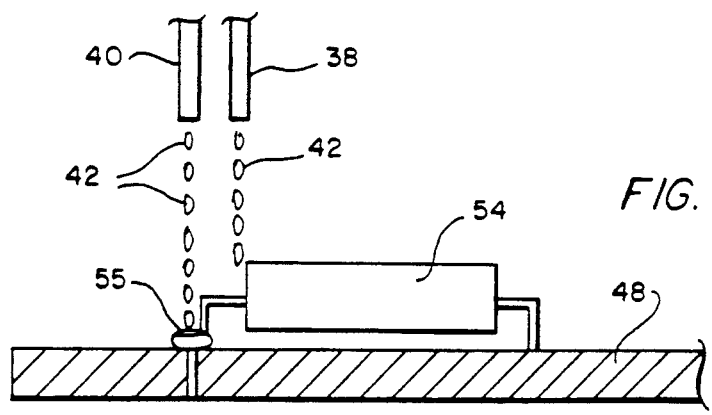
FIG. 6 is an enlarged fragmentary schematic, showing applicant's feeding of droplets 42 vertically downwardly onto circuit board 48 component 54 and its soldered connections, according to applicant's method.

As illustrated in FIGS. 4 and 6, individual needles 38, 40, which may have an outer diameter of 0.035 and an inner diameter of 0.0155 inches, discharge droplets 42 in a vertical downward direction, there is no shadowing effect with respect to the geometry of circuit board 48 components 52', 54', 56', 58' 60'.

Figure 3:
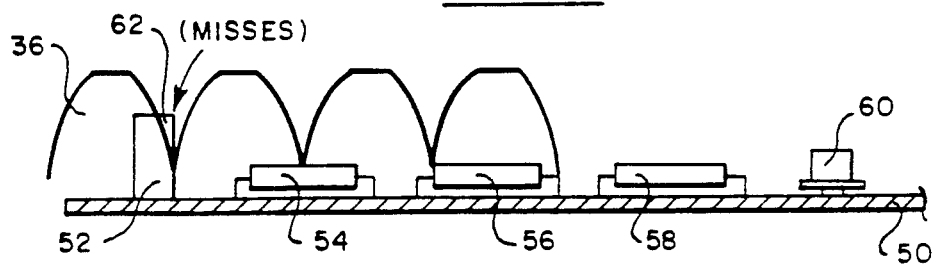
FIG. 3 is a schematic view of the NORDSON/SHIMADA technique U.S. Pat. No. 4,753,819 as applied to a printed circuit board having regular components 52, 54, 56, 58 and 60, wherein a shadowing effect 62 occurs as the flat spray pattern hits vertical component 52.
Figure 5:
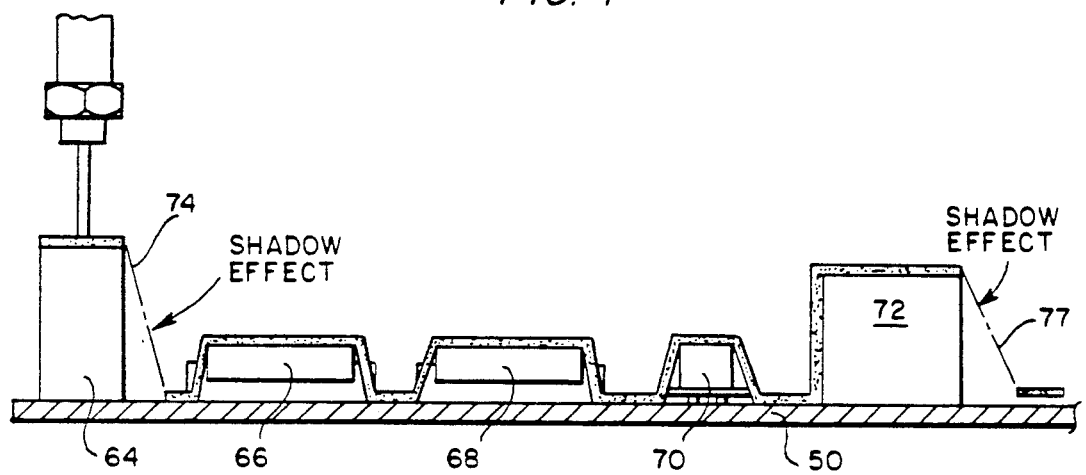
FIG. 5 is a schematic side elevational view showing the NORDSON/SHIMADA U.S. Pat. No. 4,753,819 shadow effect 74, 77 of coating 76 as applied to individual circuit board components 64, 66, 68, 70 and 72.

The conventional shadowing effect is illustrated in FIG. 3, as well as FIG. 5, wherein web 36 is applied to circuit board 50 individualized component 64, 66, 68, 70 and 72. The heavy coating 76 appears on the sides and tops of the circuit board components; however, there is a shadowing effect as at 74, 76 where the spray pattern is essentially blocked.

In contrast and according to applicant's method illustrated in FIG. 6, the coating being fed as individual droplets 42 is shown addressing component 54 as well as the solder pad connection 55.

Figure 23:
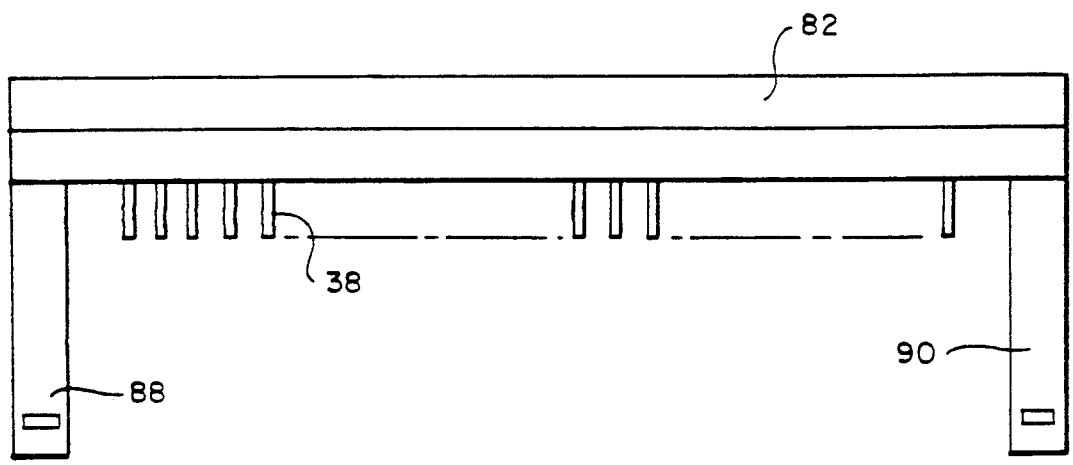
FIG. 23 is a transverse view showing manifold 82 embodying an aligned series of nozzles.

In FIGS. 7 and 23, there is illustrated a manifold 82 embodying aligned series 78, 80 of nozzles 38, 40, extending transversely across the field of advancing of the circuit board. Nozzles 38, 40 are 0.106 inches apart in each series and staggered such that there is a 0.212 distance between adjacent nozzles in each series.

Manifold 82, 84 is illustrated in FIG. 8 as embodying thirty-two coating sections 90, each coating section 90 having four dispensing nozzles 38. Thus, thirty-two coating sections each embodying four needles 38 may be employed to provide a series of 128 dispensing needles to form an eight inch manifold extending transversely across the field of advancing of the circuit board. Pump blocks 86, 88 may communicate with channels etched within manifold 82, 84, or to feed coating material via tubes 92 to the individual needles as illustrated in FIGS. 9 and 10. A bleeding screw 91 may be used to de-air dispensing tube 92 and individual sections 90. The pattern of droplets 42 flowing together on the board as at 44 is illustrated in FIG. 11.

Figure 12:
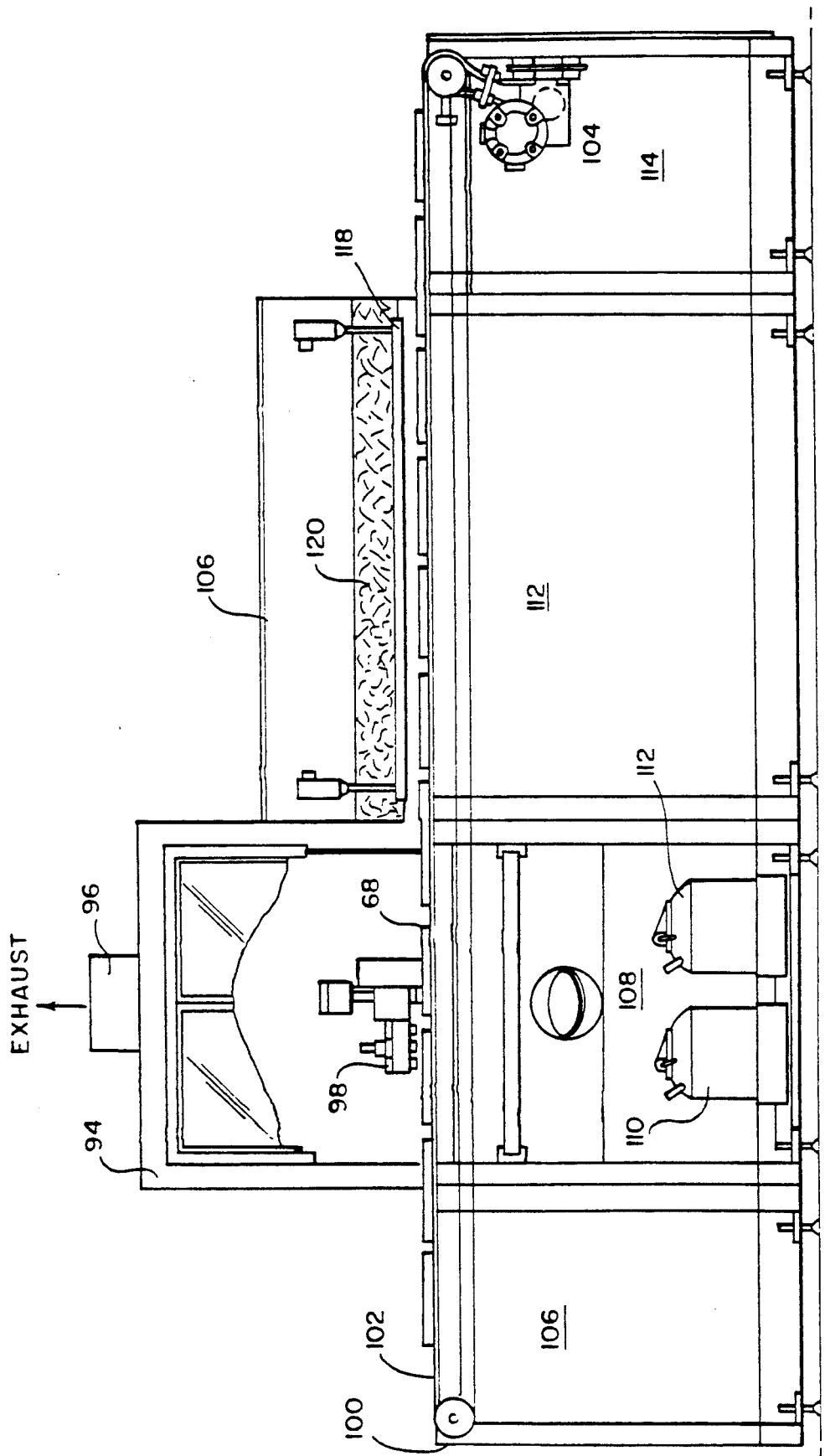
FIG. 12 is a front elevation of a selective conformal coating machine using a solvent based, heat curable coating material.

In FIG. 12 there is illustrated a conformal coating machine using a solvent based, heat curable coating material. The machine embodies a housing 94 with exhaust 96 supported upon frame 100, so as to embody load station 106, coating application station 108 with coating pressure pot 110 and solvent pressure pot 112; infrared/convection preheating station 112 with embodying infrared heating component 118 and insulative elements 120. As unload station 114 supports DC motor conveyor may drive 104. As will be apparent, the nozzle manifolds 98 may be supported transversely of the circuit boards 48 being advanced on endless conveyor 102.

Figure 13:
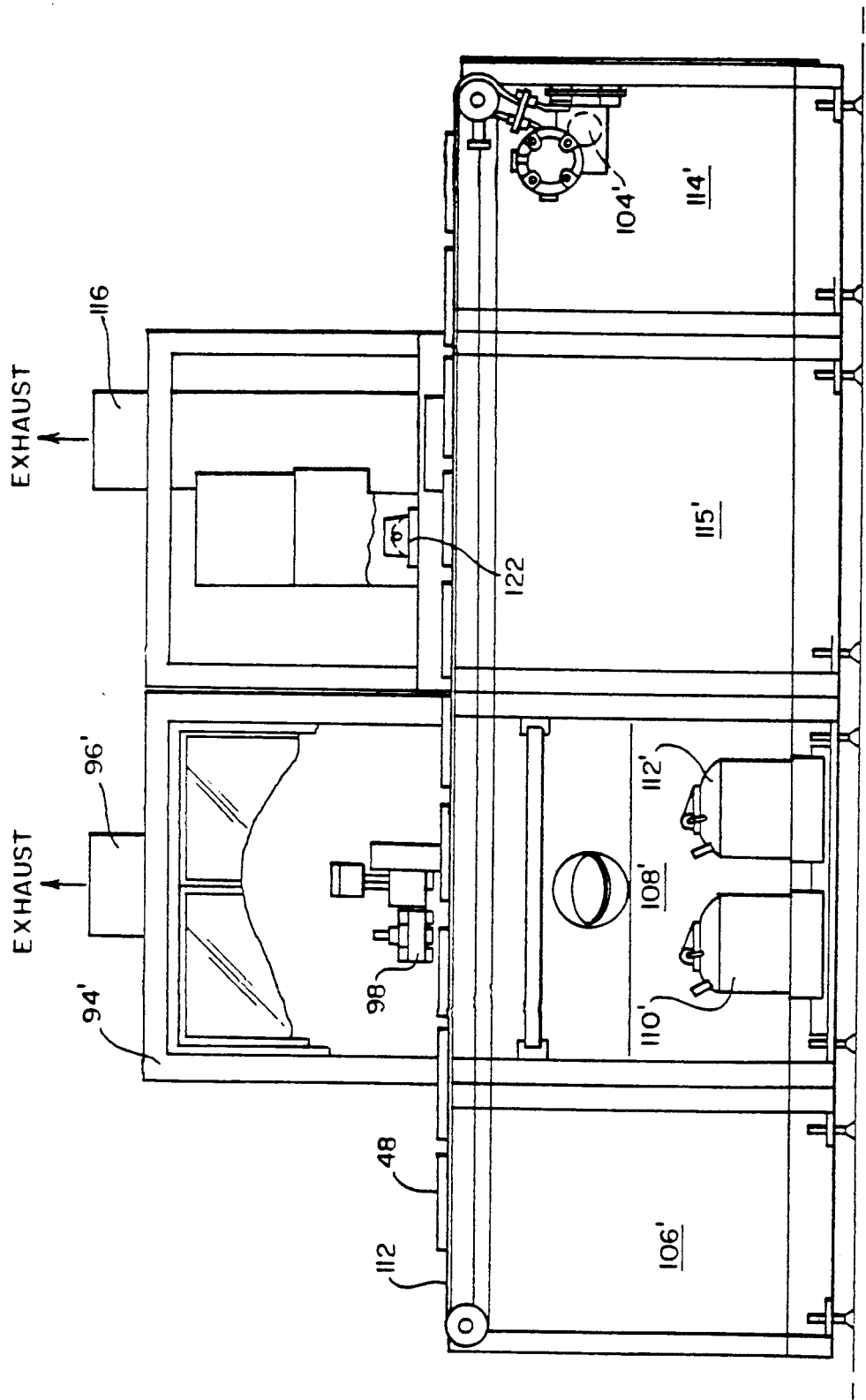
FIG. 13 is a front elevation of a discrete conformal coating machine using a solvent based, UV curable coating material.

In FIG. 13, a similar installation is illustrated for typical discrete conformal coating using a solvent based, UV curable coating material and embodying UV station 115' having UV lamp 122 and exhaust 116.

Figure 14:
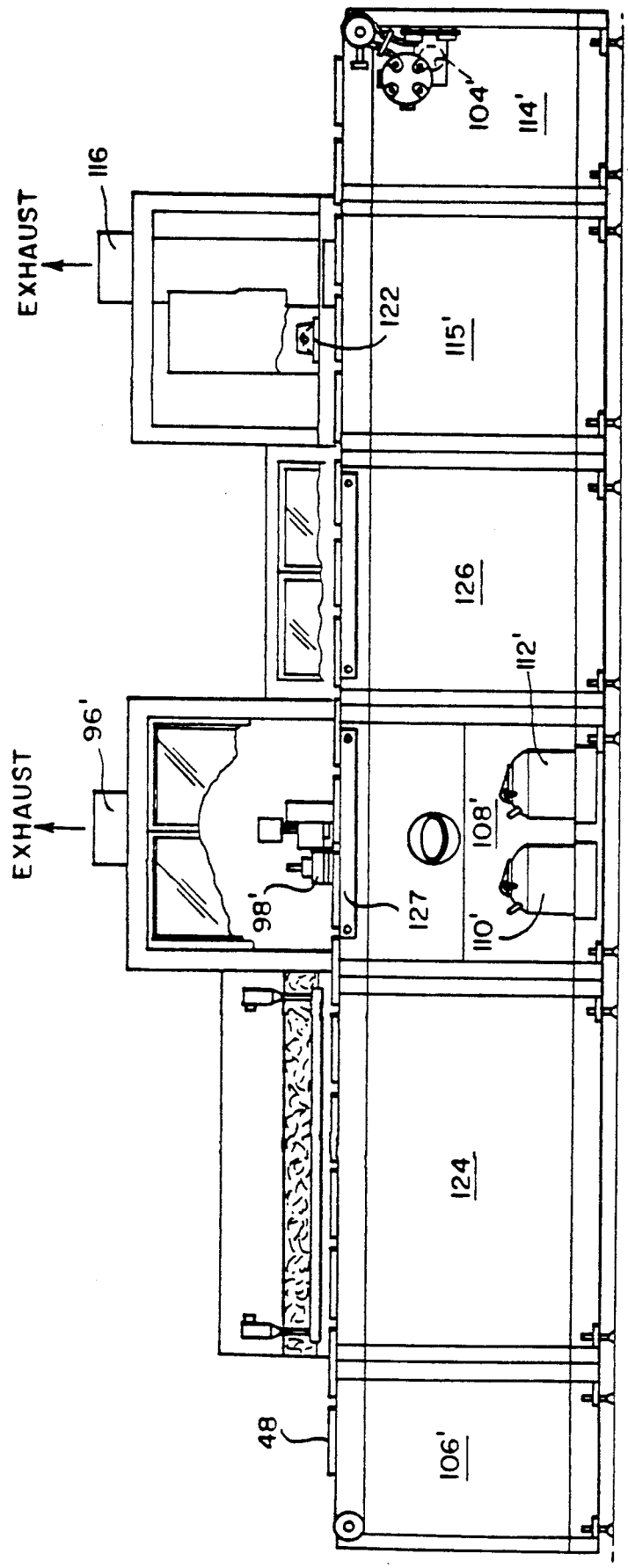
FIG. 14 is a front elevation of a discrete conformal coating machine using 100% solid UV curing material.

In FIG. 14 there is illustrated a similar installation for discrete conformal coating utilizing 100% solid, UV coating material. A IR/convection preheat station 124 is illustrated together with an inspection station 126. Hot plates 127,129 may be utilized for heating and during coating of the printed circuit board.

Figures 15, 16:
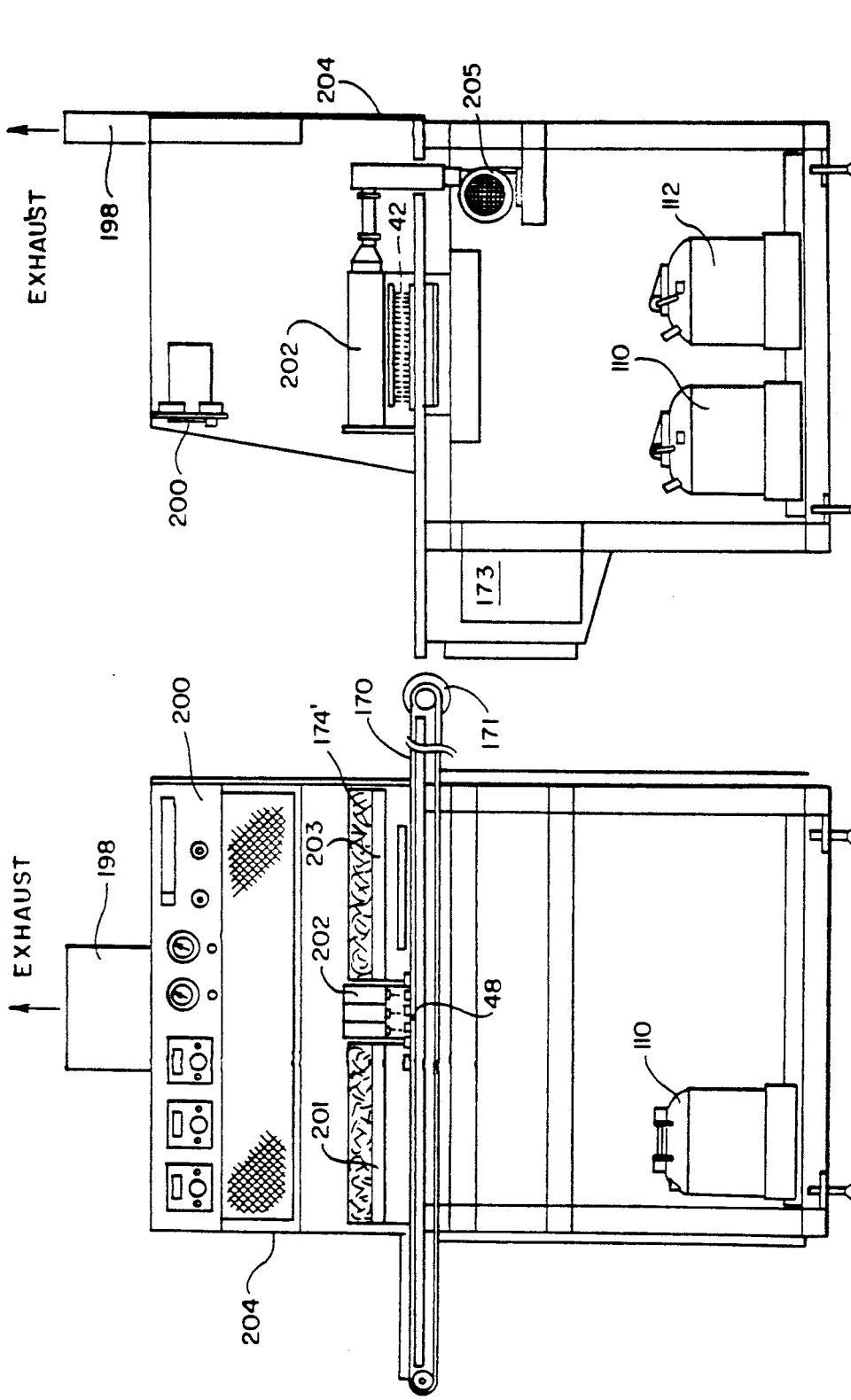
FIG. 15 is a showing of a modified coating machine involving a pre-warm station, a coating station, a flow-out and leveling station and unload station.
FIG. 16 is a side elevation of the machine illustrated in FIG. 15.

In FIGS. 15 and 16, there is illustrated a further modification wherein a fine mesh stainless steel belt 170 may be driven by five phase step motor drive sprocket 171 beneath identical infrared heaters 201, 203. The housing 204 may support nozzle manifold 202, exhaust 198 and control panel 200. As illustrated in FIG. 16, the step drive motor sprocket 171 may be driven by module and stepper driver 173. A warm air blower 205 may be employed to preheat coating material within manifold 202.

In FIG. 17 there is illustrated a modified arrangement wherein pre-filtered coating material 136 is advanced by air pressurization 138 into supply manifold 130 having individual feeding tubes 142 directed to valves 146 by means of three-way valve control 134 and in-line filter 132. Enclosure 128 may be heated by hot air 140 and the coating material may be advanced by valves 146 through sapphire orifice 150, having approximate diameter of 0.009 and an air exhaust 144 may be provided. Also, a three-way valve 154 and air supply 156 may be employed in connection with pre-filtered flush or solid material which extends to the three-way valve 134.

Figure 22:
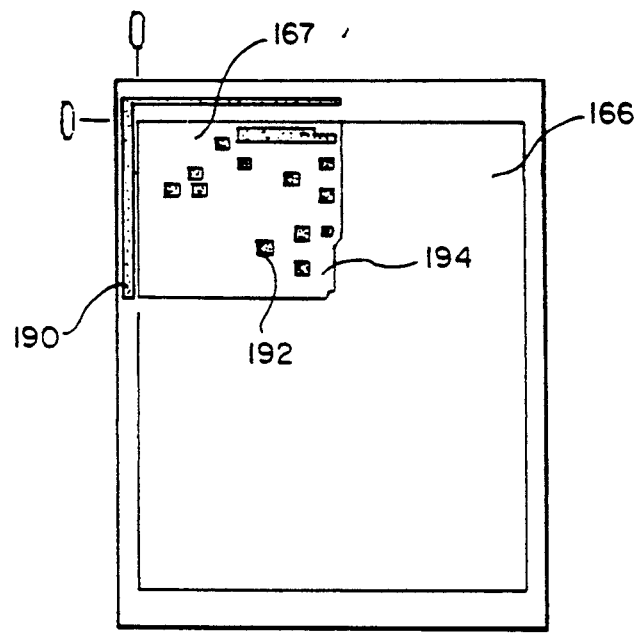
FIG. 22 is a schematic showing of a transparent film 116 embodying the printed circuit board image with non-coated areas masked in black.

As illustrated in FIG. 22, the coating station will support one hundred solenoid valves 146 in a five by twenty array and activated by electrical connection 145'. Coating material input will be through either one of two feed manifolds. Each valve output will be connected to a common orifice manifold 145. The manifold 145 will contain two rows, fifty per row, of orifice assemblies consisting of a synthetic sapphire orifice 40 and connecting tube 41, as shown in FIG. 20A. The spacing between each assembly will be 0.106 inches and 0.212 inches between each row.

Figure 20:
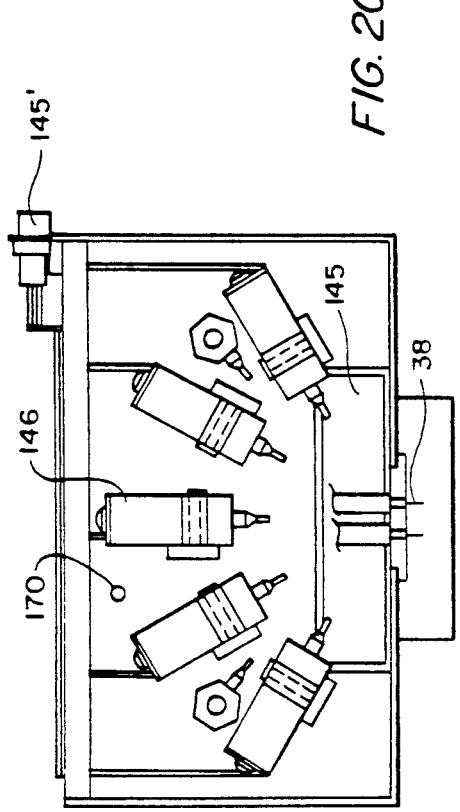
FIG. 20 is an enlarged end elevation of the machine illustrated in FIG. 17 and showing an array of coating valves 146 feeding the nozzles 38, 40.
Figure 20A:
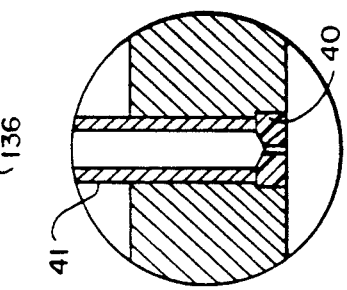
FIG. 20A is a cross sectional view of a synthetic sapphire orifice 40 and a connecting tube 41.

This arrangement is further illustrated in FIG. 20 wherein thermocouple 170 is employed to regulate the hot air supply. An electrical connection 145' may be employed to regulate the individual coating valves 146 which feed into coating manifold 143.

In FIGS. 18, 19 and 22, there is illustrated a unitary coating machine embodying load station, preheating station, selective coating station, flow-out and leveling station and unloading station with an optical scanning system 164 guided by PCB image 166 with non-coated areas masked or marked in black, conveyor drive 170 controlled by computer 158 having hard drive 160 component and individual diskettes 162, programmed according to the optical scan. The preheating zone may be controlled by panel 182 extending to infrared heater 181 and panel 184 extending to infrared heater 174. A coating control panel 168 may control the coating station 176.

In the FIG. 14, 100% solids coating machine illustrated in FIG. 4 in cure zone 126 will enhance leveling of the coating after application. All three zones 124, 108' and 126 will be independently temperature controlled.

As illustrated in FIG. 18, the optical scanner may be comprised of infrared emitting diodes and photo transistor receivers may be employed. The narrow infrared beams are spaced equally to the droplet ejecting orifices 38, 40 of the applicator.

The scanner mechanism will accept a transparent film with the PCB image of the non-coated areas blacked out; a sample format being illustrated in FIG. 22. A transparency can be produced using a CAD program or a cut and paste method.

As illustrated in FIG. 18, a custom built printed circuit board 166 will control both the scanner and the coating machine. The image sensors affixed to board 166 will pass data to the CPU via a standard I/O board plugged in the mother board. Board 166 will also contain the required driver circuits for the scanner motor, conveyor motor and the coating valves. Provisions for adjusting the pulse frequency and the duty cycle may also be included on the printed circuit board.

On start up, the computer will display a MAIN MENU. The operator may choose to SCAN a film or COAT a printed circuit board.

If SCAN is selected, the operator will be prompted to enter a name for the file and insert the film into the scanner. The board will drive the scanner's stepper motor and scan the film. The scanned data will then be passed to the CPU.

The CPU will assemble the scanned data into a file and store the file on the computer's hard drive. Once stored, the computer will return the operator to the MAIN MENU.

Upon selection of COAT, the operator will be prompted to enter the name of the coating file. After entering the file's name, the operator will be asked to enter the coating pulse frequency (5-30 HZ), duty cycle and conveyor speed (0.5 to 5 inches/second). This will start the machine's conveyor.

Placing a board 48 on the conveyor in the proper orientation is the next step. Pressing the space bar on the computer will toggle the conveyor on and off. This will allow additional time in the post bake (Zone 1) and the after bake (Zone 3) should it become necessary. This toggling is defeated during the coating operation.

A sensor looks for the leading edge of the printed circuit board and starts the valve pulsing routing at the correct time. By placing additional boards on the conveyor, the system will automatically seek and coat. Once a single board or batch has been coated and removed from the conveyor, simply press ENTER on the computer; the conveyor will stop and the screen will return to the MAIN MENU.

Manifestly, advantages of the present method for discrete conformal coating over conventional film-forming techniques include:

Better control of coating thickness is obtained and even 100% solids coating materials can be applied within military specification thickness requirements.

Coating materials need not be circulated.

Very narrow coating/masking tolerances can be achieved.

No shadow effect occurs.

One sweep application is easily obtained.

No bubbles are left in the cured film.

The method gives 100% transfer efficiency.

Simplified programming and program storage is facilitated.

I claim:

1. A method for applying a conformal coating to a surface comprising the steps of:
   a) supplying a coating material under pressure to a plurality of parallel nozzles to provide a series of aligned droplets of the coatings material emanating from the outlet of the nozzles;
   b) positioning the surface at a distance below the outlet of the nozzles such that the droplets fall downward and contact the surface prior to any substantial contacting between the droplets themselves;
   c) advancing the surface below the nozzles in a generally transverse direction to the aligned droplets; and
   d) permitting the droplets to flow together on the surface and form the conformal coating.

2. The method of claim 1 wherein the distance between the surface and the outlet of the nozzles is from about 1.0 to about 1.5 inches.

3. Method of claim 1, including advancing said surface to be coated at a rate of 0.5 to 5 inches per second.

4. Method of claim 1, further including staggering the series of aligned droplets transversely with respect to adjacent series of aligned droplets, so as to avoid bridging of coating between droplets prior to feeding onto said advancing surface.

5. Method of claim 4, wherein each series of aligned droplets is approximately 0.212 inches apart from each adjacent series.

6. Method of claim 4, wherein said staggering of adjacent series of droplets is approximately 0.106 inches.

7. Method of claim 1, including pre-heating the coating.

8. Method of claim 1, including pre-heating said advancing surface, so as to promote flowing together of droplets upon the advancing surface.

9. Method of claim 1, wherein said varying the rate of feeding includes programming a duty cycle of feeding according to the characteristics of said advancing surface.

10. Method of claim 8, including post-heating the advancing surface.

* * * * *